(12) United States Patent
Tripathi et al.

(10) Patent No.: US 10,784,883 B1
(45) Date of Patent: Sep. 22, 2020

(54) NOISE SHAPING ANALOG-TO-DIGITAL CONVERTER

(71) Applicant: QUALCOMM Incorporated, San Diego, CA (US)

(72) Inventors: Prateek Tripathi, Cambridge (GB); Behzad Sheikholeslami, Cambridge (GB); Marceline Kelly Tchambake Yapti, Waterbeach (GB)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/664,554

(22) Filed: Oct. 25, 2019

(51) Int. Cl.
| | |
|---|---|
| *H03M 1/66* | (2006.01) |
| *H03M 1/44* | (2006.01) |
| *H03M 1/12* | (2006.01) |
| *H03M 1/06* | (2006.01) |
| *H03M 1/74* | (2006.01) |
| *H03M 1/80* | (2006.01) |
| *H03M 1/00* | (2006.01) |

(52) U.S. Cl.
CPC ............ *H03M 1/442* (2013.01); *H03M 1/06* (2013.01); *H03M 1/124* (2013.01); *H03M 1/66* (2013.01); *H03M 1/00* (2013.01); *H03M 1/001* (2013.01); *H03M 1/747* (2013.01); *H03M 1/804* (2013.01)

(58) Field of Classification Search
CPC ........ H03M 1/747; H03M 1/804; H03M 1/00; H03M 1/001; H03M 1/124

USPC .................. 341/144, 172, 161, 110, 122, 163
See application file for complete search history.

(56) References Cited

U.S. PATENT DOCUMENTS

| | | | |
|---|---|---|---|
| 9,369,140 B1 * | 6/2016 | Sundaresan | ........... G01S 7/5208 |
| 9,425,818 B1 | 8/2016 | Rajee et al. | |
| 2010/0001892 A1 * | 1/2010 | Aruga | ................ H03M 1/1047 341/172 |

OTHER PUBLICATIONS

Chen, Zhijie, et al.; A 9.35-ENOB, 14.8 fJ/conv-step Fully-Passive Noise-Shaping SAR ADC; IEEE 2015 Symposium on VLSI Circuits (VLSI Circuits), Jun. 17-19, 2015; 2 pages.

* cited by examiner

*Primary Examiner* — Joseph J Lauture
(74) *Attorney, Agent, or Firm* — Loza & Loza, LLP/Qualcomm

(57) ABSTRACT

In certain aspects, an analog-to-digital converter includes a first capacitive digital-to-analog converter (DAC), a second capacitive DAC, and a comparator including a first input, a second input, and an output. The analog-to-digital converter also includes a switch circuit including a first input coupled to the first capacitive DAC, a second input coupled to the second capacitive DAC, a first output coupled to the first input of the comparator, and a second output coupled to the second input of the comparator. The analog-to-digital converter further includes a first switch coupled between the output of the comparator and the first input of the comparator, and a successive approximation register (SAR) coupled to the output of the comparator, the first capacitive DAC, and the second capacitive DAC.

24 Claims, 11 Drawing Sheets

NOISE SHAPING ANALOG-TO-DIGITAL CONVERTER

BACKGROUND

Field

Aspects of the present disclosure relate generally to analog-to-digital conversion, and more particularly, to analog-to-digital converters (ADCs).

Background

An analog-to-digital converter (ADC) is used to convert an analog signal into a digital signal. One type of ADC is the successive approximation register (SAR) ADC, which is power efficient and takes up less area compared with other types of ADCs. SAR ADCs have become popular for analog-to-digital conversion in devices (e.g., wireless mobile devices) due to improved capacitor matching and the availability of very small capacitors in modern processes.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an analog-to-digital converter. The analog-to-digital converter includes a first capacitive digital-to-analog converter (DAC), a second capacitive DAC, and a comparator including a first input, a second input, and an output. The analog-to-digital converter also includes a switch circuit including a first input coupled to the first capacitive DAC, a second input coupled to the second capacitive DAC, a first output coupled to the first input of the comparator, and a second output coupled to the second input of the comparator. The analog-to-digital converter further includes a first switch coupled between the output of the comparator and the first input of the comparator, and a successive approximation register (SAR) coupled to the output of the comparator, the first capacitive DAC, and the second capacitive DAC.

A second aspect relates to a method for noise shaping in an analog-to-digital converter. The analog-to-digital converter includes a first capacitive digital-to-analog converter (DAC), a second DAC, and a comparator. The method includes coupling an output of the first capacitive DAC to a first input of the comparator, coupling an output of the second capacitive DAC to a second input of the comparator, and coupling an output of the comparator to the first input of the comparator.

A third aspect relates to an apparatus for noise shaping in an analog-to-digital converter. The analog-to-digital converter includes a first capacitive digital-to-analog converter (DAC), a second DAC, and a comparator. The apparatus includes means for coupling an output of the first capacitive DAC to a first input of the comparator, means for coupling an output of the second capacitive DAC to a second input of the comparator, and means for coupling an output of the comparator to the first input of the comparator.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
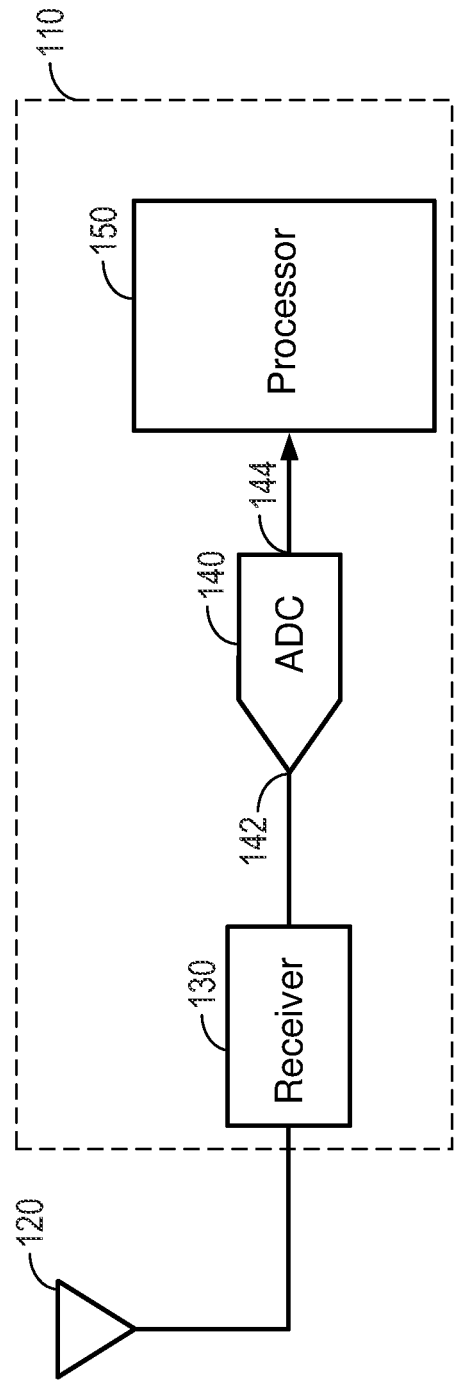
FIG. 1 shows an example of a system including an ADC according to certain aspects of the present disclosure.

An ADC may be used in a system to convert an analog signal into a digital signal. In this regard, FIG. 1 shows an example of a system 110 including an ADC 140 according to certain aspects. The ADC 140 is configured to convert an analog signal at an input 142 of the ADC 140 into a digital signal, and output the digital signal at an output 144 of the ADC 140. The system 110 also includes a receiver 130 coupled to the input 142 of the ADC 140, and a processor 150 coupled to the output 144 of the ADC 140. In this example, the system 110 may be part of a wireless communication device (e.g., a handset).

The receiver 130 may be coupled to one or more antennas 120, and may be configured to receive a radio frequency (RF) signal via the one or more antennas 120. The RF signal may be transmitted from a base station, an access point, or another wireless communication device. The receiver 130 may be configured to process the received RF signal into an analog baseband signal, and output the analog baseband signal to the ADC 140 for digital conversion. Processing performed by the receiver 130 may include frequency down-conversion, filtering, amplification, etc. The ADC 140 converts the analog baseband signal into a digital signal, and outputs the digital signal to the processor 150. The processor 150 may process the digital signal to recover data from the digital signal and process the recovered data. Processing performed by the processor 150 may include demodulation, decoding, etc. The processor 150 may include a processor core, a digital signal processor (DSP), an application specific integrated circuit (ASIC), a field programmable gate array (FPGA) or other programmable logic device, or any combination thereof.

Figure 2:
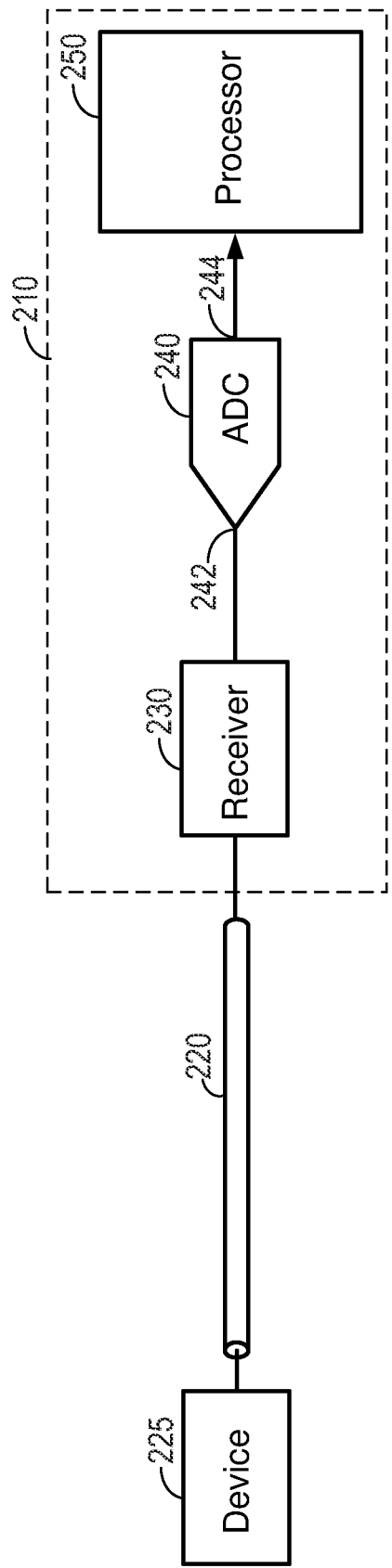
FIG. 2 shows another example of a system including an ADC according to certain aspects of the present disclosure.

FIG. 2 shows another example of a system 210 including an ADC 240 according to certain aspects. The ADC 240 is configured to convert an analog signal at an input 242 of the ADC 240 into a digital signal, and output the digital signal at an output 244 of the ADC 240. The system 210 also includes a receiver 230 coupled to the input 242 of the ADC 240, and a processor 250 coupled to the output 244 of the ADC 240.

In this example, the receiver 230 may be coupled to a wired channel 220, and may be configured to receive an analog signal via the wired channel 220. The wired channel 220 (also referred to as a wired link) may include one or more metal traces, one or more metal wires, a cable, or any combination thereof. In this example, the wired channel 220 may used to provide communication between a device 225 and the processor 250, in which a transmit driver (not shown) in the device 225 transmits the analog signal to the receiver 230 over the wired channel 220. The device 225 may include a peripheral device, a sensor device (e.g., a temperature sensor, a medical sensor, etc.) or another type of device.

In this example, the receiver 230 may process the analog signal from the wired channel 220 into a processed analog signal, and output the processed analog signal to the ADC 240 for digital conversion. Processing performed by the receiver 230 may include amplification, equalization, etc. The ADC 240 converts the processed analog signal into a digital signal, and outputs the digital signal to the processor 250. The processor 250 may then process the digital signal to recover data from the digital signal and process the recovered data. For the example in which the device 225 includes a sensor device, the analog signal may include an analog sensor reading. In this example, the ADC 240 may convert the analog sensor reading into a digital sensor reading, which is then processed by the processor 250 in the digital domain. The processor 250 may include a processor core, a digital signal processor (DSP), an application specific integrated circuit (ASIC), a field programmable gate array (FPGA) or other programmable logic device, or any combination thereof.

The ADC 140 in FIG. 1 and the ADC 240 in FIG. 2 may each be implemented using a successive approximation register (SAR) ADC. A SAR ADC includes a comparator, a digital-to-analog converter (DAC), and a successive approximation register (SAR). The SAR outputs a digital signal to the DAC, which converts the digital signal into an output voltage. The comparator compares the output voltage of the DAC with an analog input voltage, and outputs a compare signal based on the comparison to the SAR. The SAR successively resolves the bits of the digital signal based on the compare signal, in which the resolved bits of the digital signal provide the digital output of the SAR ADC. Various implementations for the SAR (e.g., employing flip-flops and/or combination logic) are known in the art.

Figure 3:
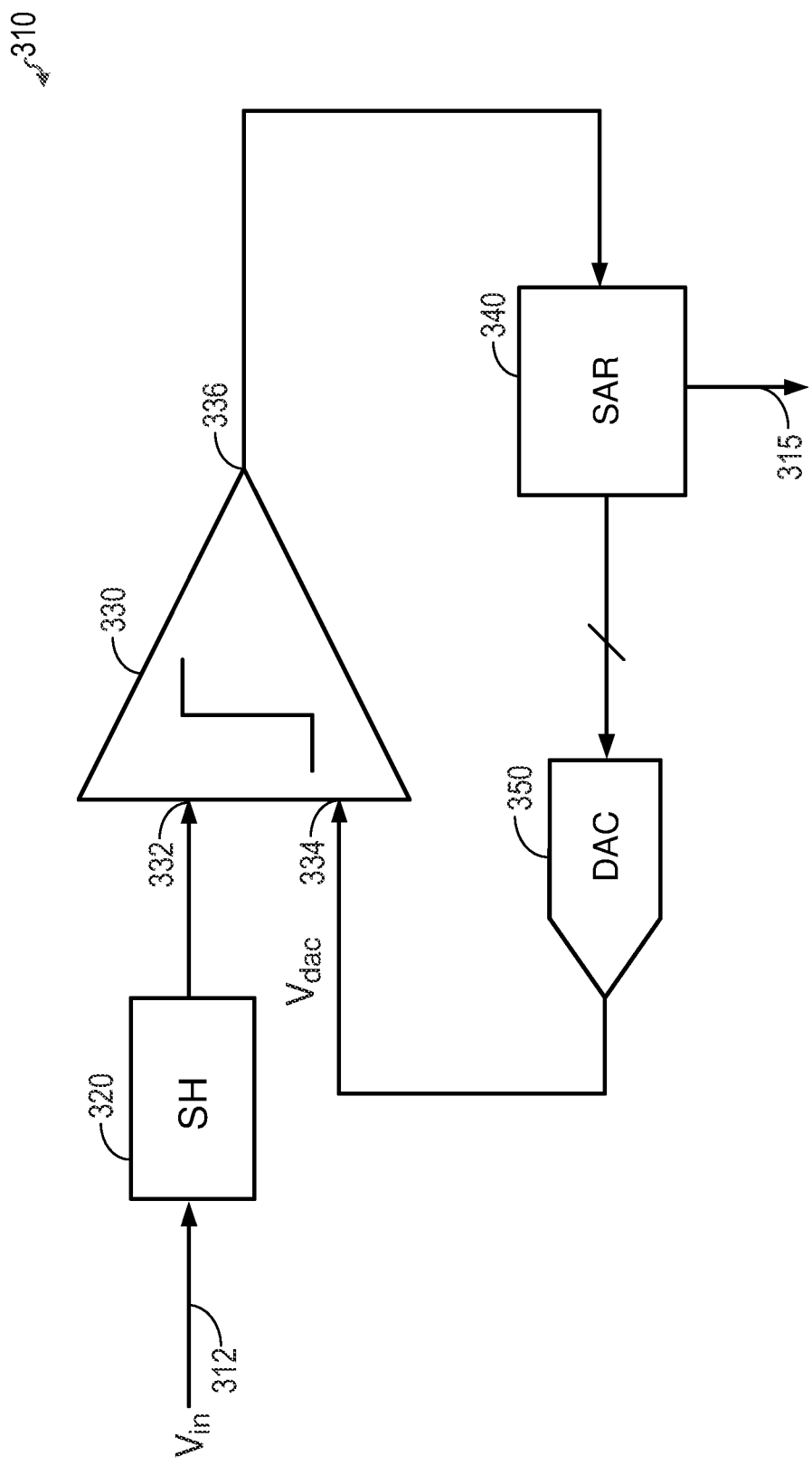
FIG. 3 shows an example of a SAR ADC according to certain aspects of the present disclosure.

FIG. 3 shows a simplified block diagram of an example of a SAR ADC 310 according to aspects of the present disclosure. The SAR ADC 310 is configured to receive an analog input voltage (labeled "$V_{in}$") at an analog input 312, convert the analog input voltage $V_{in}$ into a digital value, and output the digital value at a digital output 315. The digital value provides a digital representation of the analog input voltage $V_{in}$.

The SAR ADC 310 includes a sample and hold circuit 320, a comparator 330, an SAR 340, and a DAC 350. The sample and hold circuit 320 is configured to sample the analog input voltage $V_{in}$ at the analog input 312, and hold the sampled analog input voltage $V_{in}$ at a first input 332 of the comparator 330. The DAC 350 may be an N-bit DAC configured to convert an N-bit digital signal from the SAR 340 into a DAC voltage (labeled "$V_{dac}$"), and output the DAC voltage $V_{dac}$ to a second input 334 of the comparator 330. The DAC voltage $V_{dac}$ may be given as follows:

$$V_{dac} = b_1 \cdot \frac{V_{ref}}{2} + b_2 \cdot \frac{V_{ref}}{4} + b_3 \cdot \frac{V_{ref}}{8} + \ldots + b_N \cdot \frac{V_{ref}}{2^N} \qquad (1)$$

where $V_{ref}$ is a reference voltage, and $b_1$ to $b_N$ are the N bits of the digital signal from the SAR 340. In this example, $b_1$ is the most significant bit (MSB) and $b_N$ is the least significant bit (LSB). Each of the bits $b_1$ to $b_N$ has a value of one or zero.

The comparator 330 is configured to compare the sampled analog input voltage $V_{in}$ with the DAC voltage $V_{dac}$, and output a compare signal at an output 336, in which the logic value (i.e., logic state) of the compare signal indicates which of the two voltages is greater. In one example, the compare signal is one if the sampled analog input voltage $V_{in}$ is greater than the DAC voltage $V_{dac}$, and the compare signal is zero if the sampled analog input voltage $V_{in}$ is less than the DAC voltage $V_{dac}$. The SAR 340 is configured to convert the sampled analog input voltage $V_{in}$ into a digital value using the comparator 330 and the DAC 350, as discussed further below.

The SAR ADC 310 is configured to convert the analog input voltage $V_{in}$ into a digital value at the digital output 315 in an analog-to-digital conversion operation that includes a sampling phase and a conversion phase. During the sampling phase, the sample and hold circuit 320 samples the analog input voltage $V_{in}$ at the analog input 312 of the SAR ADC 310. During the conversion phase, the sample and hold circuit 320 holds the sampled analog input voltage $V_{in}$ at the first input 332 of the comparator 330.

During the conversion phase, the SAR 340 converts the sampled analog input voltage $V_{in}$ into a digital value using the comparator 330 and the DAC 350. To do this, the SAR 340 outputs a digital signal to the DAC 350, and sequentially resolves the N bits $b_1$ to $b_N$ of the digital signal based on the compare signal from the output 336 of the comparator 330 utilizing a binary search. The SAR 340 starts the binary search with the MSB $b_1$. To resolve the MSB $b_1$, the SAR 340 sets the MSB $b_1$ to one and the remaining bits $b_2$ to $b_N$ to zero. This causes the DAC 350 to output a voltage of $V_{ref}/2$ to the second input 334 of the comparator 330 (i.e., $V_{dac}=V_{ref}/2$). The SAR 340 then resolves the MSB $b_1$ based on the output of the comparator 330. If the compare signal is one (i.e., the sampled analog input voltage $V_{in}$ is greater than $V_{ref}/2$), then the SAR 340 resolves the MSB $b_1$ to a bit value of one. If the compare signal is zero (i.e., the sampled analog input voltage $V_{in}$ is less than $V_{ref}/2$), then the SAR 340 resolves the MSB $b_1$ to a bit value of zero.

After resolving the MSB $b_1$, the SAR 340 resolves the second most significant bit $b_2$. To resolve bit $b_2$, the SAR 340 sets the MSB $b_1$ to its resolved bit value, sets bit $b_2$ to one, and sets the remaining bits $b_3$ to $b_N$ to zero. The SAR 340 then resolves bit $b_2$ based on the output of the comparator 330. If the compare signal is one, then the SAR 340 resolves bit $b_2$ to a bit value of one. If the compare signal is zero, then the SAR 340 resolves bit $b_2$ to a bit value of zero.

The SAR 340 may repeat the above process for each of the remaining bits $b_3$ to $b_N$ to resolve the remaining bits $b_3$ to $b_N$. After all N bits $b_1$ to $b_N$ of the digital signal have been resolved, the SAR 340 may output the resolved bits $b_1$ to $b_N$ at the digital output 315 of the SAR ADC 310, in which the resolved bits $b_1$ to $b_N$ constitute a digital value that provides a digital representation of the sampled analog input voltage $V_{in}$.

Figure 4:
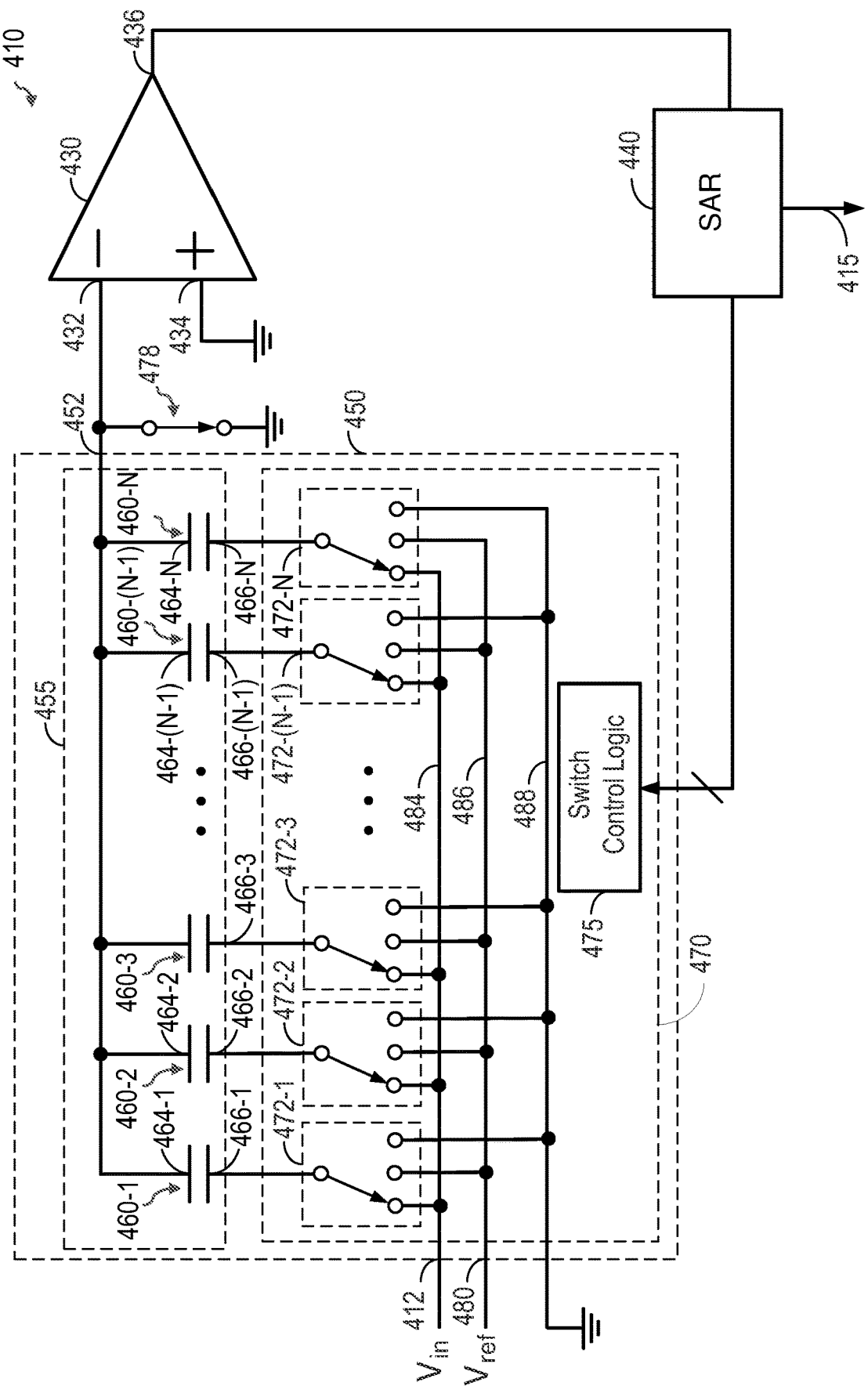
FIG. 4 shows an example of a SAR ADC including a capacitive digital-to-analog converter (DAC) according to certain aspects of the present disclosure.

In certain aspects, the DAC 350 is implemented with a capacitive DAC. In these aspects, the sample and hold function may be integrated into the capacitive DAC, eliminating the need for a separate sample and hold circuit. FIG. 4 shows an example of a SAR ADC 410 including a capacitive DAC 450 according to aspects of the present disclosure. The SAR ADC 410 also includes a comparator 430, a switch 478, and SAR 440. The SAR ADC 410 is configured to receive an analog input voltage $V_{in}$ at an analog input 412, convert the analog input voltage $V_{in}$ into a digital value, and output the digital value at a digital output 415. The digital value provides a digital representation of the analog input voltage $V_{in}$.

The capacitive DAC 450 is configured to sample and hold the analog input voltage $V_{in}$. The capacitive DAC 450 is also configured to convert an N-bit digital signal from the SAR 440 into a DAC voltage $V_{dac}$, and subtract the sampled analog input voltage $V_{in}$ from the DAC voltage $V_{dac}$, as discussed further below. The DAC voltage $V_{dac}$ may be given by equation (1) discussed above. In this example, the output voltage of the capacitive DAC 450 may be equal to the DAC voltage $V_{dac}$ minus the sampled analog input voltage $V_{in}$. Thus, in this example, the output voltage of the capacitive DAC 450 is negative if the sampled analog input voltage $V_{in}$ is greater than the DAC voltage $V_{dac}$, and positive if the sampled analog input voltage $V_{in}$ is less than the DAC voltage $V_{dac}$.

In the example in FIG. 4, the comparator 430 includes a first input 432 coupled to an output 452 of the capacitive DAC 450, and a second input 434 coupled to ground. The comparator 430 is configured to compare the output voltage of the capacitive DAC 450 with ground, and output a compare signal based on the comparison. In one example, the compare signal has a logic value of one if the output voltage of the capacitive DAC 450 is negative (i.e., the sampled analog input voltage $V_{in}$ is greater than the DAC voltage $V_{dac}$), and a logic value of zero if the output voltage of the capacitive DAC 450 is positive (i.e., sampled analog input voltage $V_{in}$ is less than the DAC voltage $V_{dac}$). The SAR 440 is configured to convert the sampled analog input voltage $V_{in}$ into a digital value using the comparator 430 and the capacitive DAC 450, as discussed further below.

In the example in FIG. 4, the capacitive DAC 450 includes a capacitor array 455 and a switch network 470. The capacitor array 455 includes a set of capacitors 460-1 to 460-N, in which each of the capacitors 460-1 to 460-N corresponds to a respective one of the bits $b_1$ to $b_N$ of the digital signal. More particularly, capacitor 460-1 corresponds to the MSB $b_1$ and capacitor 460-N corresponds to the LSB $b_N$ of the digital signal. The capacitors 460-1 to 460-N have binary-weighted capacitances, in which the capacitor 460-1 corresponding to the MSB $b_1$ has the largest capacitance and the capacitor 460-N corresponding to the LSB $b_N$ has the smallest capacitance. In the example in FIG. 4, each of the capacitors 460-1 to 460-(N−1) has approximately twice the capacitance of the capacitor to the immediate right. For example, capacitor 460-1 has twice the capacitance of capacitor 460-2, capacitor 460-2 has twice the capacitance of capacitor 460-3, and so forth. Each of the capacitors 460-1 to 460-N has a respective first terminal 464-1 to 464-N coupled to the output 452 of the capacitive DAC 450.

The switch network 470 includes switches 472-1 to 472-N, in which each of the switches 472-1 to 472-N is coupled to a respective one of the capacitors 460-1 to 460-N in the capacitor array 455. Each of the switches 472-1 to 472-N is configured to selectively couple a second terminal 466-1 to 466-N of the respective capacitor 460-1 to 460-N to an input line 484, a reference line 486 or a ground line 488, as discussed further below. The input line 484 is coupled to the analog input 412 of the SAR ADC 410, and is configured to receive the analog input voltage $V_{in}$. The reference line 486 is coupled to a reference input 480, and is configured to receive the reference voltage $V_{ref}$. The ground line 488 is coupled to ground.

The switch network 470 may also include switch control logic 475 configured to receive the digital signal from the SAR 440, and control the switches 472-1 to 472-N based on the bit values of the digital signal. For ease of illustration, the individual connections between the switches 472-1 to 472-N and the switch control logic 475 are not shown in FIG. 4. In one example, if a bit of the digital signal is one, then the switch control logic 475 causes the respective one of the switches 472-1 to 472-N to couple the second terminal 466-1 to 466-N of the respective one of the capacitors 460-1 to 460-N to the reference line 486. If a bit of the digital signal is zero, then the switch control logic 475 causes the respective one of the switches 472-1 to 472-N to couple the second terminal 466-1 to 466-N of the respective one of the capacitors 460-1 to 460-N to the ground line 488.

The SAR ADC 410 is configured to convert the analog input voltage $V_{in}$ into a digital value in an analog-to-digital conversion operation that includes a sampling phase and a conversion phase. During the sampling phase, the SAR 440 closes the switch 478, which couples the output 452 of the capacitive DAC 450 to ground. In addition, the switch control logic 475 causes the switches 472-1 to 472-N to couple the second terminals 466-1 to 466-N of the capacitors 460-1 to 460-N to the input line 484, which receives the analog input voltage $V_{in}$. As a result, the capacitor array 455 is charged to the analog input voltage $V_{in}$, thereby sampling the analog input voltage $V_{in}$. Note that FIG. 4 shows the positions of the switches 472-1 to 472-N and 478 during the sampling phase.

At the start of the conversion phase, the SAR 440 opens the switch 478. In addition, the switch control logic 475 causes the switches 472-1 to 472-N to couple the second terminals 466-1 to 466-N of the capacitors 460-1 to 460-N to the ground line 488. This holds the sampled analog input voltage $V_{in}$ in the capacitor array 455, and drives the output 462 of the capacitor array 455 to a voltage approximately equal to the negative of the sampled analog input voltage $V_{in}$ (i.e., $-V_{in}$).

During the conversion phase, the SAR 440 outputs the digital signal to the capacitive DAC 450, and sequentially resolves the N bits $b_1$ to $b_N$ of the digital signal based on the compare signal output from the output 436 the comparator 430. In one example, the SAR 440 may resolve the N bits $b_1$ to $b_N$ utilizing a binary search. In this example, the SAR 440 starts the binary search with the MSB $b_1$. To resolve the MSB $b_1$, the SAR 440 sets the MSB $b_1$ to one, and sets the remaining bits $b_2$ to $b_N$ to zero. This causes the capacitive DAC 450 to output a voltage of $V_{ref}/2$ minus the sampled analog input voltage $V_{in}$ (i.e., $V_{ref}/2-V_{in}$) to the first input 432 of the comparator 430. The compare signal is one if the sampled analog input voltage $V_{in}$ is greater than $V_{ref}/2$ (i.e., $V_{ref}/2-V_{in}<0$) and the compare signal is zero if the sampled analog input voltage $V_{in}$ is less than $V_{ref}/2$ (i.e., $V_{ref}/2-V_{in}>0$).

The SAR 440 then resolves the MSB $b_1$ based on the output of the comparator 430. If the compare signal is one (i.e., the sampled analog input voltage $V_{in}$ is greater than $V_{ref}/2$), then the SAR 440 resolves the MSB $b_1$ to a bit value of one. If the compare signal is zero (i.e., the sampled analog input voltage $V_{in}$ is less than $V_{ref}/2$), then the SAR 440 resolves the MSB $b_1$ to a bit value of zero.

After resolving the MSB $b_1$, the SAR 440 resolves the second most significant bit $b_2$. To resolve bit $b_2$, the SAR 440 sets the MSB $b_1$ to its resolved bit value, sets bit $b_2$ to one, and leaves the remaining bits $b_3$ to $b_N$ set to zero. The SAR 440 then resolves bit $b_2$ based on the output of the comparator 430. If the compare signal is one, then the SAR 440 resolves bit $b_2$ to a bit value of one. If the compare signal is zero, then the SAR 340 resolves bit $b_2$ to a bit value of zero.

The SAR 440 then resolves bit $b_3$. To resolve bit $b_3$, the SAR 340 sets bit $b_1$ and bit $b_2$ to their respective resolved bit values, sets bit $b_3$ to one, and sets the remaining bits $b_4$ to $b_N$ to zero. The SAR 440 then resolves bit $b_3$ based on the output of the comparator 430. If the compare signal is one, then the SAR 440 resolves bit $b_3$ to a bit value of one. If the compare signal is zero, then the SAR 440 resolves bit $b_3$ to a bit value of zero.

The SAR 440 may repeat the above process for each of the remaining bits $b_4$ to $b_N$ to resolve the remaining bits $b_4$ to $b_N$. After all N bits $b_1$ to $b_N$ of the digital signal have been resolved, the SAR 440 may output the resolved bits $b_1$ to $b_N$ at the digital output 415 of the SAR ADC 410, in which the resolved bits $b_1$ to $b_N$ constitute a digital value that provides a digital representation of the sampled analog input voltage $V_{in}$.

At the end of the conversion phase, a residue voltage is left at the output 452 of the capacitive DAC 450. The residue voltage $V_{res}$ may be given by the following:

$$V_{res} = -V_{in} + V_{dac} \quad (2)$$

where $V_{dac}$ in equation (2) is the DAC voltage after all N bits $b_1$ to $b_N$ of the digital value have been resolved. Thus, the residue voltage $V_{res}$ is a function of the difference between the sampled analog input voltage $V_{in}$ and the DAC voltage $V_{dac}$ at the end of the conversion phase. The residue voltage $V_{res}$ represents quantization noise of the SAR ADC 410.

The SAR ADC 410 may periodically perform the analog-to-digital conversion operation to track changes in the input analog voltage $V_{in}$. For example, the SAR ADC 410 may perform the analog-to-digital conversion operation at a rate of R analog-to-digital conversion operations per unit of time (e.g., second). In this example, the SAR ADC 410 performs the analog-to-digital conversion operation once per conversion cycle, where the length of one conversion cycle (i.e., period) may be approximately equal to 1/R unit of time (e.g., second).

As discussed above, the SAR ADC 410 has quantization noise resulting in a residue voltage $V_{res}$ on the capacitor array 455 at the end of a conversion phase. The quantization noise may be reduced using noise shaping given in the z-domain by the following:

$$Y = X + (1 - z^{-1})Q \quad (3)$$

where Y corresponds to the output of the SAR ADC, X corresponds to the input of the SAR ADC, and Q is the quantization noise. The noise shaping expressed in equation (3) may be implemented by feeding back the residue from a previous conversion cycle to the current conversion cycle.

The noise shaping may be implemented using large capacitors to transfer residue charge from the previous conversion cycle to the current conversion cycle. A drawback of this approach is that it may require the use of large capacitors that are much larger (e.g., ten times larger) than the capacitive DAC, which significantly increases the size of the SAR ADC. Other approaches for implementing the noise shaping use complex filtering and additional high-performance amplifiers.

Figure 5:
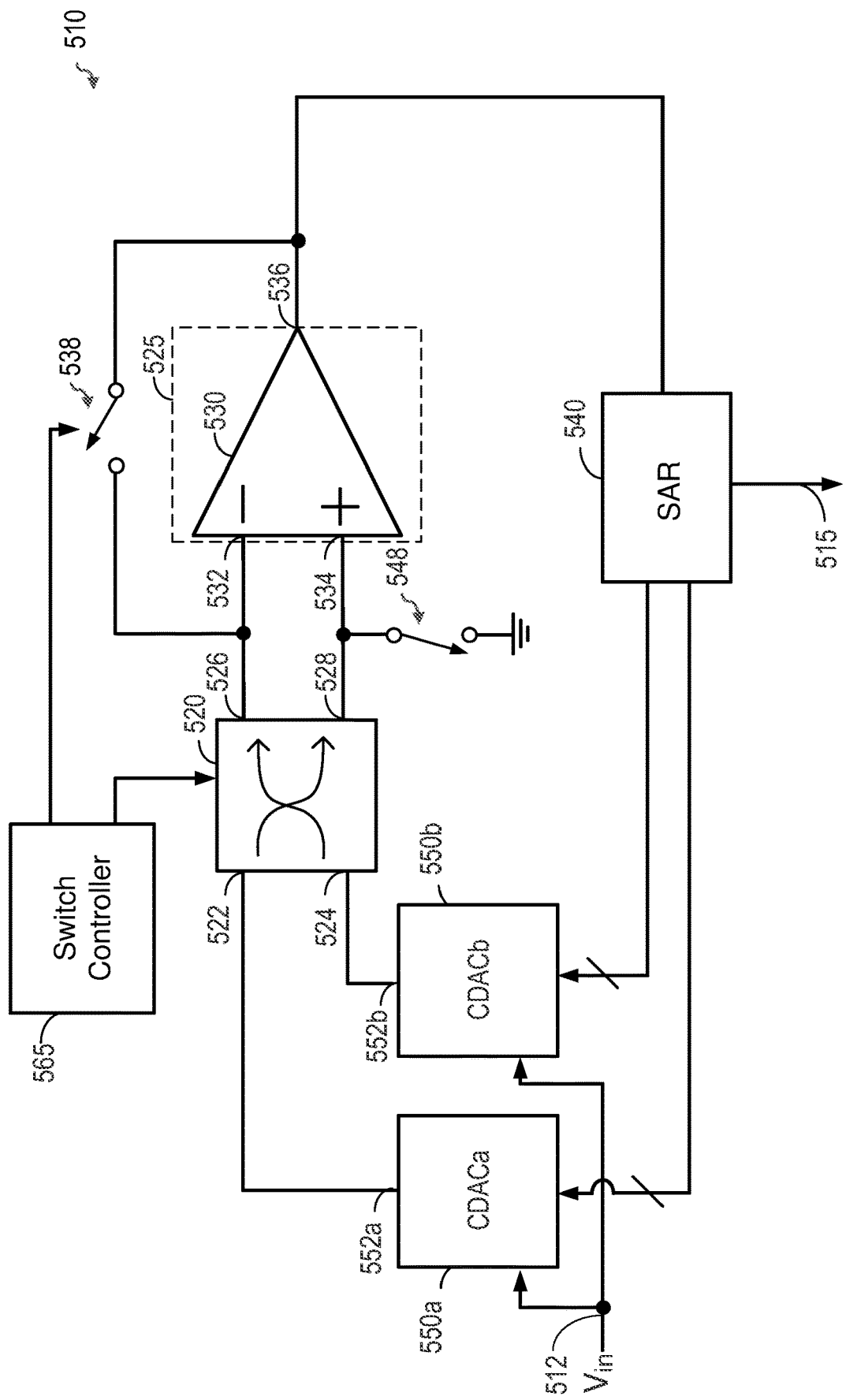
FIG. 5 shows an example of a SAR ADC with noise shaping according to certain aspects of the present disclosure.

FIG. 5 shows an example of a SAR ADC 510 with noise shaping according to aspects of the present disclosure. The SAR ADC 510 overcomes one or more of the drawbacks of the above noise-shaping approaches, as discussed further below. The SAR ADC 510 includes an analog input 512 configured to receive an analog input voltage $V_{in}$ and a digital output 515. The SAR ADC 510 is configured to convert the analog input voltage $V_{in}$ at the analog input 512 into a digital value, and output the digital value at a digital output 515. The digital value provides a digital representation of the analog input voltage $V_{in}$.

The SAR ADC 510 includes a first capacitive DAC 550a, a second capacitive DAC 550b, a switch circuit 520, a comparator 525, a first switch 538, a second switch 548, SAR 540, and a switch controller 565. Each of the first capacitive DAC 550a and the second capacitive DAC 550b may be implemented with the capacitive DAC 450 shown in FIG. 4 (i.e., each of the first capacitive DAC 550a and the second capacitive DAC 550b may be a separate instance of the capacitive DAC 450 shown in FIG. 4). However, it is to be appreciated that the first capacitive DAC 550a and the second capacitive DAC 550b are not limited to the exemplary implementation shown in FIG. 4. The SAR 540 may be implemented with an application specific integrated circuit (ASIC), a field programmable gate array (FPGA) or other programmable logic device, flip-flops, discrete hardware components (e.g., logic gates), or any combination thereof designed to perform the functions of the SAR 540 described herein.

In this example, the comparator 525 is implemented with an amplifier 530. The amplifier 530 includes an inverting input coupled to a first input 532 of the comparator 525, a non-inverting input coupled to a second input 534 of the comparator 525, and an output coupled to an output 536 of the comparator 525. The first switch 538 is coupled between the output of the amplifier 530 and the inverting input of the amplifier 530. As discussed further below, the first switch 538 is used to selectively switch the amplifier 530 between a feedback mode and a compare mode. The amplifier 530 may be implemented with an operational amplifier.

The switch circuit 520 includes a first input 522 coupled to the output 552a of the first capacitive DAC 550a, a second input 524 coupled to the output 552b of the second capacitive DAC 550*b*, a first output 526 coupled to the first input 532 of the comparator 525 (i.e., the inverting input of the amplifier 530), and a second output 528 coupled to the second input 534 of the comparator 525 (i.e., the non-inverting input of the amplifier 530). The switch circuit 520 is configured to selectively couple the first input 522 to the first output 526 or the second output 528 under the control of the switch controller 565. Thus, the switch circuit 520 allows the output 552*a* of the first capacitive DAC 550*a* to be selectively coupled to the first input 532 or the second input 534 of the comparator 525. The switch circuit 520 is also configured to selectively couple the second input 524 to the first output 526 or the second output 528 under the control of the switch controller 565. Thus, the switch circuit 520 allows the output 552*b* of the second capacitive DAC 550*b* to be selectively coupled to the first input 532 or the second input 534 of the comparator 525. The switch circuit 520 may be implemented with a crossbar switch.

The second switch 548 is coupled between the second input 534 of the comparator 525 (i.e., the non-inverting input of the amplifier 530) and ground. The second switch 548 may be controlled by the switch controller 565. For ease of illustration, the connection between the switch controller 565 and the second switch 548 is not shown in FIG. 5.

The switch controller 565 is configured to operate the comparator 525 in the compare mode or the feedback mode. In the feedback mode, the switch controller 565 closes the first switch 538, and opens the second switch 548. Closing the first switch 538 forms a negative-feedback loop between the output of the amplifier 530 and the inverting input of the amplifier 530 through the first switch 538. The negative-feedback loop creates a virtual short between the inputs of the amplifier 530, which is used to transfer residue voltage from the non-inverting input of the amplifier 530 to the inverting input of the amplifier 530, as discussed further below. In the compare mode, the switch controller 565 opens the first switch 538, and closes the second switch 548. Opening the first switch 538 disables the negative feedback loop, allowing the amplifier 530 to operate as a comparator, as discussed further below.

During operation, the SAR ADC 510 may perform analog-to-digital conversion operations at a rate of R analog-to-digital conversion operations per unit of time (e.g., second) to track changes in the analog input voltage $V_{in}$ at the analog input 512 of the SAR ADC 510. Each analog-to-digital conversion operation includes a sampling phase in which the analog input voltage $V_{in}$ is sampled and a conversion phase in which the sampled analog input voltage $V_{in}$ is converted into a digital value. In this example, the SAR ADC 510 may perform one analog-to-digital conversion operation per conversion cycle, where the length of one conversion cycle (i.e., period) may be approximately equal to 1/R unit of time (e.g., second).

In certain aspects, the SAR ADC 510 alternates between using the first capacitive DAC 550*a* and the second capacitive DAC 550*b* to convert the input analog voltage $V_{in}$ into a digital value. For example, the SAR ADC 510 may use the first capacitive DAC 550*a* during odd conversion cycles, and the second capacitive DAC 550*b* during even conversion cycles, or vice versa. To implement noise shaping, the switch controller 565 closes the first switch 538 at the beginning of each conversion cycle to operate the amplifier 530 in the feedback mode to transfer the residue voltage from the previous conversion cycle to the current conversion cycle, as discussed further below.

Figure 6A:
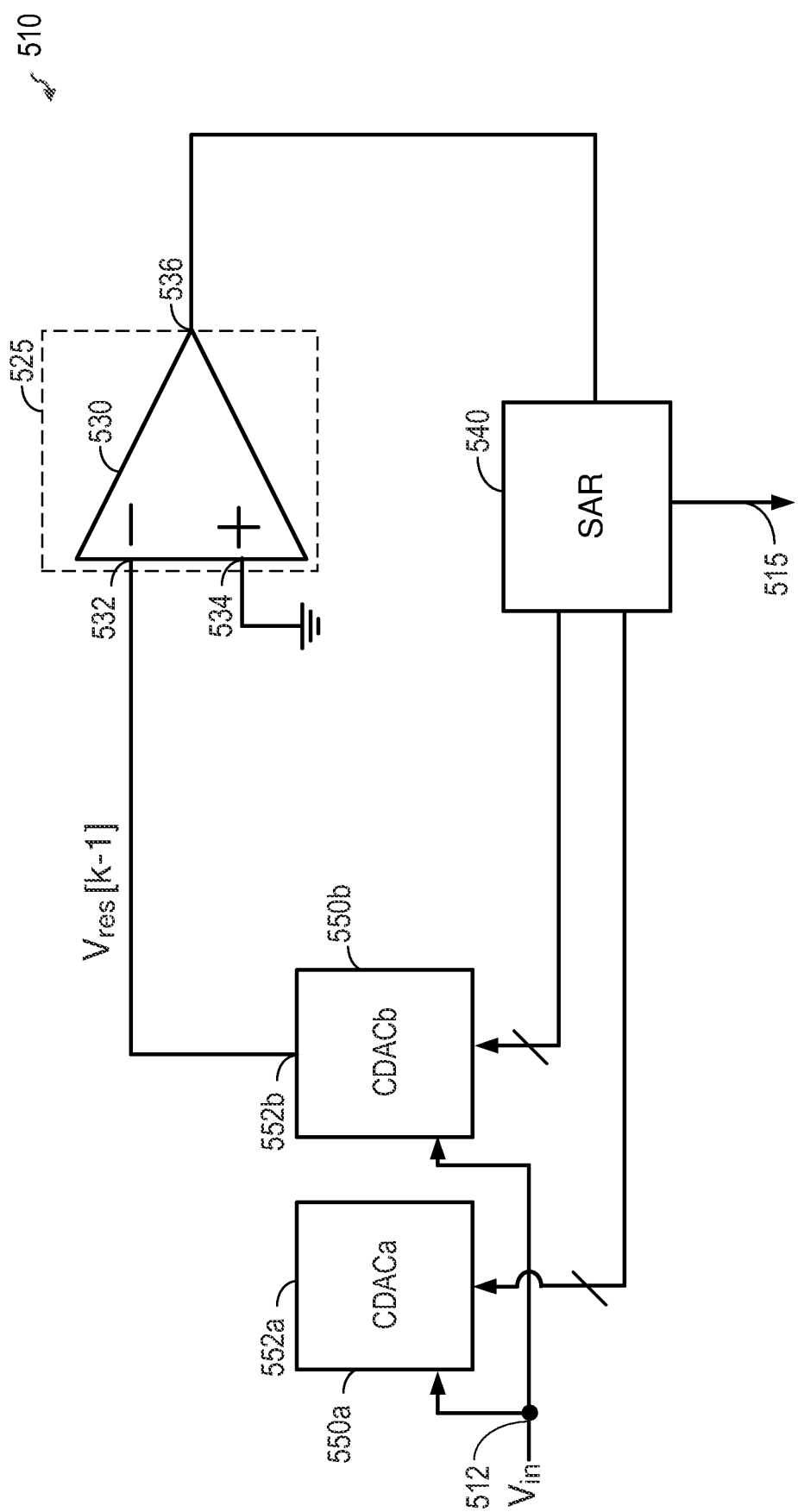
FIG. 6A shows an example of an equivalent circuit of the SAR ADC during a conversion phase of a $(k-1)^{th}$ conversion cycle according to certain aspects of the present disclosure.

Exemplary operations of the SAR ADC 510 will now be discussed with reference to FIGS. 6A to 6E according to certain aspects. FIG. 6A shows an example of an equivalent circuit of the SAR ADC 510 at the end of the $(k-1)^{th}$ conversion cycle, in which the second capacitive DAC 550*b* is used for analog-to-digital conversion. In this example, the switch controller 565 (shown in FIG. 5) instructs the switch circuit 520 (shown in FIG. 5) to couple the output 552*b* of the second capacitive DAC 550*b* to the first input 532 of the comparator 525. In addition, the switch controller 565 operates the comparator 525 in the compare mode. At the end of the $(k-1)^{th}$ conversion cycle, a residue voltage of $V_{res}[k-1]$ is left at the output 552*b* of the second capacitive DAC 550*b*.

Figure 6B:
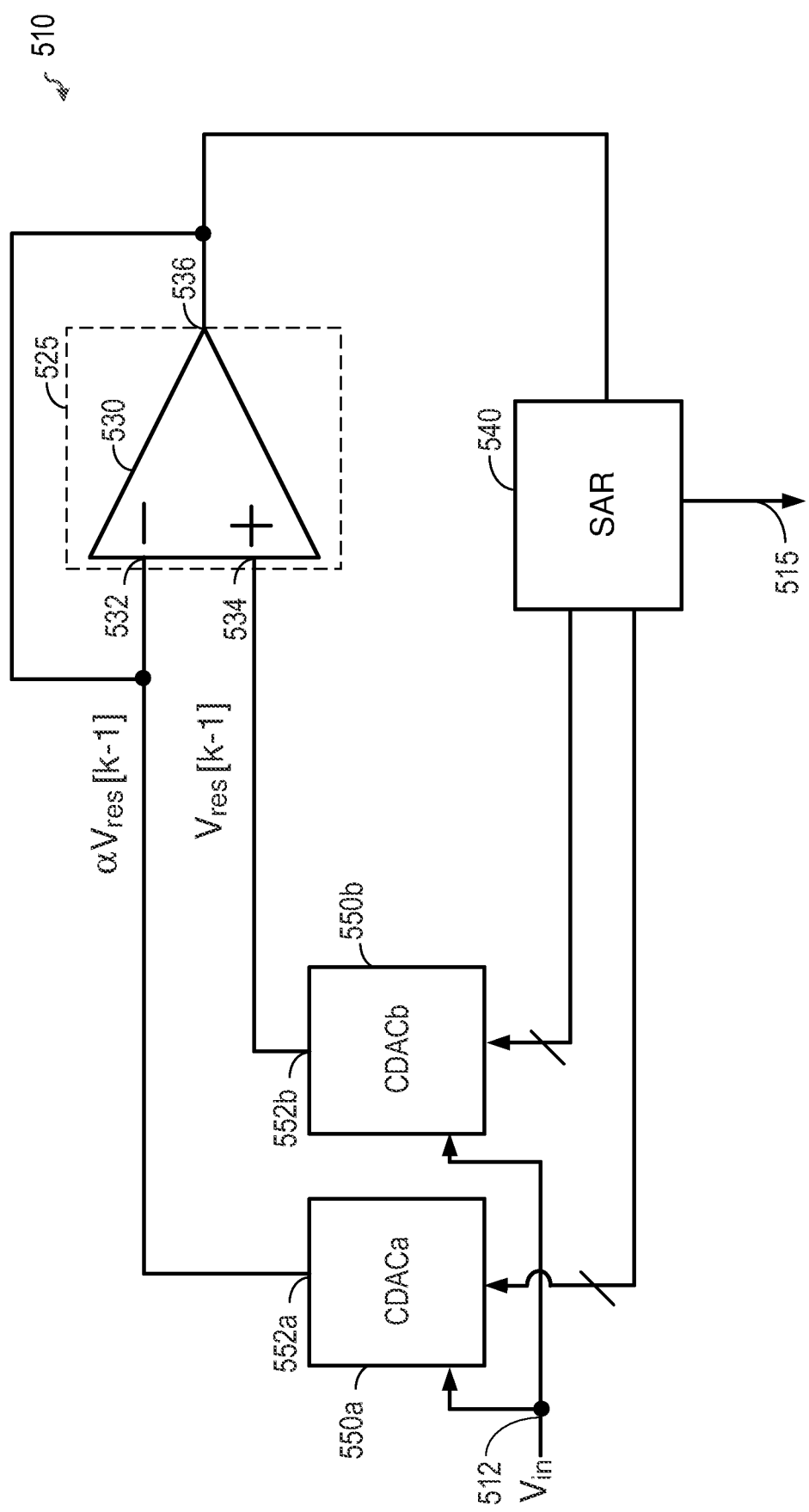
FIG. 6B shows an example of an equivalent circuit of the SAR ADC during a sampling phase of a $k^{th}$ conversion cycle according to certain aspects of the present disclosure.

After the $(k-1)^{th}$ conversion cycle, the SAR ADC 510 begins the $k^{th}$ conversion cycle. FIG. 6B shows an example of an equivalent circuit of the SAR ADC 510 during the sampling phase of the $k^{th}$ conversion cycle. In this example, the switch controller 565 instructs the switch circuit 520 (shown in FIG. 5) to couple the output 552*a* of the first capacitive DAC 550*a* to the first input 532 of the comparator 525, and couple the output 552*b* of the second capacitive DAC 550*b* to the second input 534 of the comparator 525. In addition, the switch controller 565 closes the first switch 538 and opens the second switch 548 to operate the comparator 525 in the feedback mode, in which a negative feedback loop is formed between the output of the amplifier 530 and the inverting input of the amplifier 530 through the first switch 538. The negative-feedback loop creates a virtual short between the inputs of the amplifier 530, which transfers the voltage residue $V_{res}[k-1]$ from the previous conversion cycle (i.e., the $(k-1)^{th}$ conversion cycle) on the output 552*b* of the second capacitive DAC 550*b* to the output 552*a* of the first capacitive DAC 550*a*. Thus, the voltage residue $V_{res}[k-1]$ from the previous conversion cycle (i.e., the $(k-1)^{th}$ conversion cycle) is added to the output 552*a* of the first capacitive DAC 550*a* during the sampling phase of the current conversion cycle (i.e., the $k^{th}$ conversion cycle). In the example in FIG. 6B, the voltage residue $V_{res}[k-1]$ transferred to the first capacitive DAC 550*a* may be multiplied by a coefficient α. Also, during the sampling phase, the first capacitive DAC 550*a* samples the input analog voltages $V_{in}$ at the analog input 512 of the SAR ADC 510.

Figure 6C:
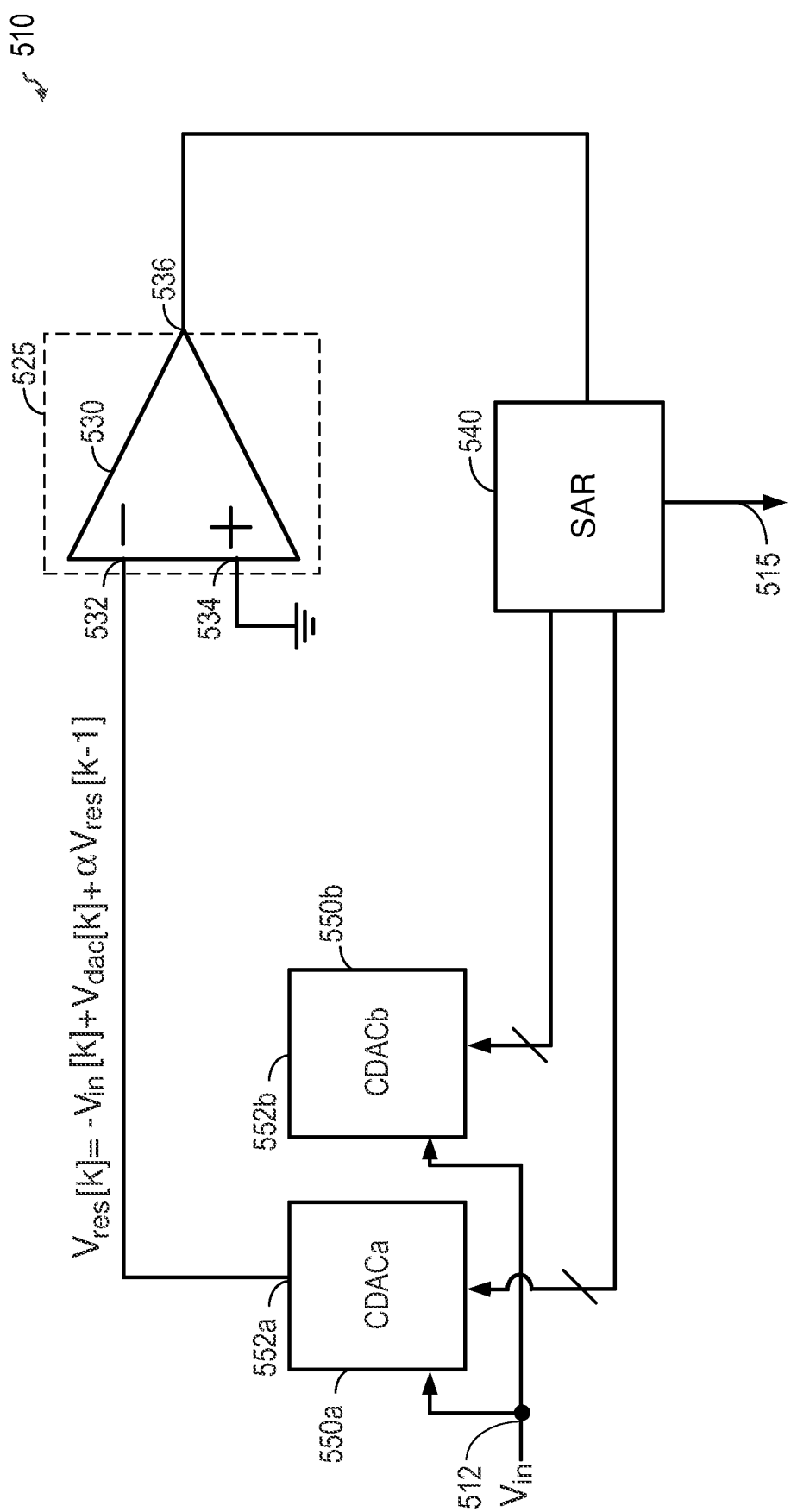
FIG. 6C shows an example of an equivalent circuit of the SAR ADC during a conversion phase of the $k^{th}$ conversion cycle according to certain aspects of the present disclosure.

After the input analog voltages $V_{in}$ has been sampled, the SAR ADC 510 enters the conversion phase of the $k^{th}$ conversion cycle. FIG. 6C shows an example of an equivalent circuit of the SAR ADC 510 during the conversion phase of the $k^{th}$ conversion cycle. At the start of the conversion phase, the switch controller 565 (shown in FIG. 5) opens the first switch 538 (shown in FIG. 5) and closes the second switch 548 to operate the comparator 525 in the compare mode, in which the negative-feedback loop is disabled. The switch circuit 520 (shown in FIG. 5) leaves the output 552*a* of the first capacitive DAC 550*a* coupled to the first input 532 of the comparator 525.

During the conversion phase for the $k^{th}$ conversion cycle, the SAR 540 converts the sampled input analog voltages $V_{in}$ into a first digital value using the first capacitive DAC 550*a*. To do this, the SAR 540 may output a first digital signal to the first capacitive DAC 550*a*, and sequentially resolve the N bits $b_1$ to $b_N$ of the first digital signal based on the compare signal output from the comparator 525. For example, the SAR 540 may resolve the N bits $b_1$ to $b_N$ using the exemplary binary search discussed above with reference to FIG. 4. After all N bits $b_1$ to $b_N$ of the first digital signal have been resolved, the SAR 540 may output the resolved bits $b_1$ to $b_N$ as the first digital value at the digital output 515 of the SAR ADC 510.

At the end of the conversion phase for the $k^{th}$ conversion cycle, the residue voltage at the output 552a of the first capacitive DAC 550a is given by the following:

$$V_{res}[k] = \alpha \cdot V_{res}[k-1] - V_{in}[k] + V_{dac}[k] \quad (4)$$

where $V_{dac}[k]$ in equation (4) is the DAC voltage after all N bits $b_1$ to $b_N$ of the first digital value have been resolved for the $k^{th}$ conversion cycle. As shown in equation (4), the residue voltage $V_{res}[k]$ for the $k^{th}$ conversion cycle includes the residue voltage $V_{res}[k-1]$ from the previous conversion cycle (i.e., the $(k-1)^{th}$ conversion cycle). This is because the residue voltage from $V_{res}[k-1]$ from the previous conversion cycle is transferred to the first capacitive DAC 550a during the sampling phase of the $k^{th}$ conversion cycle. The transfer of the residue voltage $V_{res}[k-1]$ from the previous conversion cycle (i.e., the $(k-1)^{th}$ conversion cycle) to the current conversion cycle (i.e., the $k^{th}$ conversion cycle) provides noise shaping corresponding to the noise shaping expressed in equation (3). The noise shaping reduces in-band quantization noise and may significantly improve the signal-to-quantization ratio (SQNR).

Figure 6D:
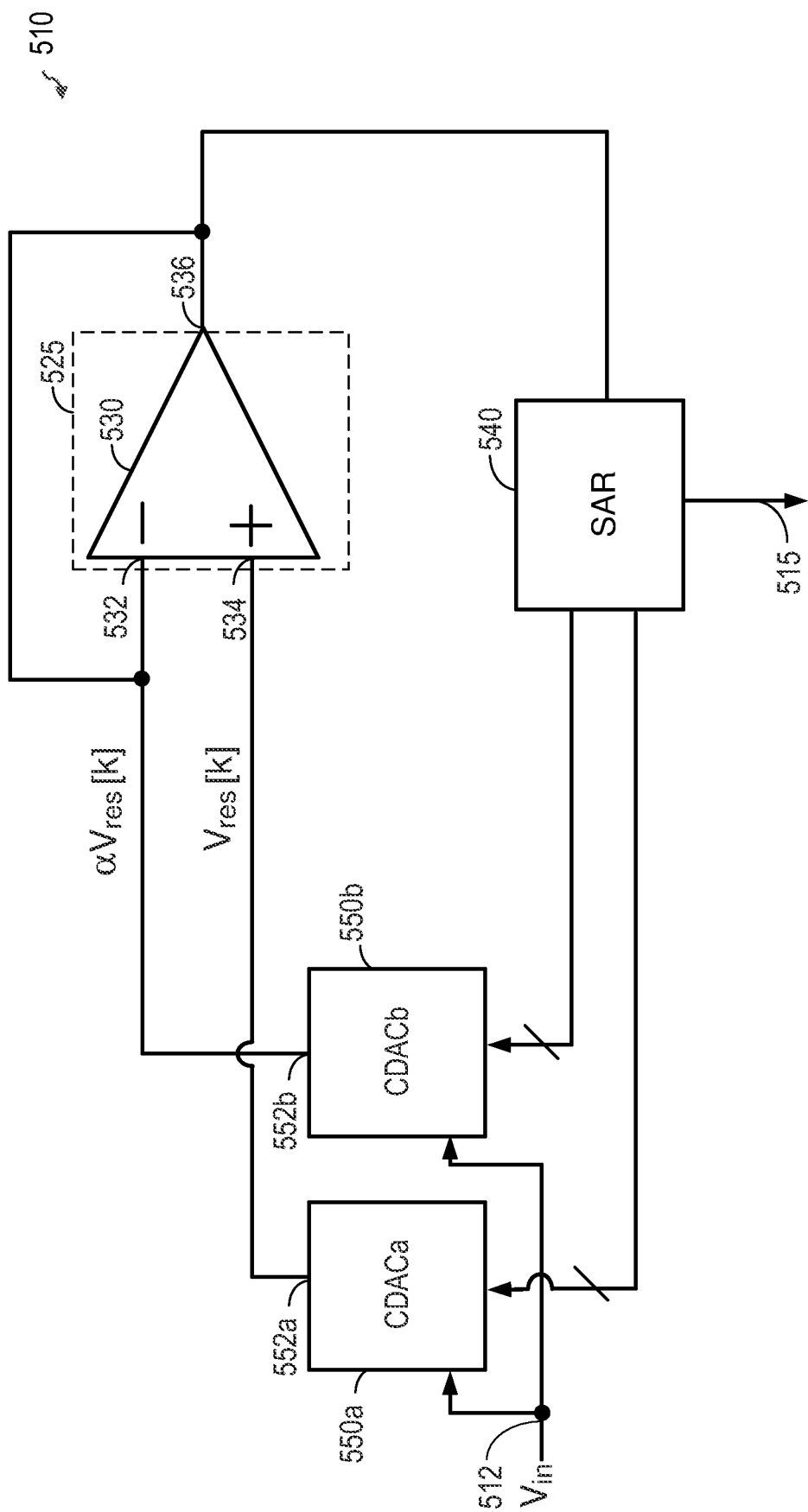
FIG. 6D shows an example of an equivalent circuit of the SAR ADC during a sampling phase of a $(k+1)^{th}$ conversion cycle according to certain aspects of the present disclosure.

After the $k^{th}$ conversion cycle, the SAR ADC 510 starts the $(k+1)^{th}$ conversion cycle. FIG. 6D shows an example of an equivalent circuit of the SAR ADC 510 during the sampling phase of the $(k+1)^{th}$ conversion cycle. In this example, the switch controller 565 (shown in FIG. 5) instructs the switch circuit 520 (shown in FIG. 5) to couple the output 552b of the second capacitive DAC 550b to the first input 532 of the comparator 525, and couple the output 552a of the first capacitive DAC 550a to the second input 534 of the comparator 525. In addition, the switch controller 565 closes the first switch 538 and opens the second switch 548 to operate the amplifier 530 of the comparator 525 in the feedback mode during the sampling phase of the $(k+1)^{th}$ conversion cycle. This causes the amplifier 530 to transfer the voltage residue $V_{res}[k]$ from the $k^{th}$ conversion cycle on the output 522a of the first capacitive DAC 550a to the output 552b of the second capacitive DAC 550b. Thus, the voltage residue $V_{res}[k]$ from the $k^{th}$ conversion cycle is added to the output 552b of the second capacitive DAC 550b during the sampling phase of the $(k+1)^{th}$ conversion cycle. Also, during the sampling phase, the second capacitive DAC 550b samples the input analog voltages $V_{in}$ at the analog input 512 of the SAR ADC 510.

Figure 6E:
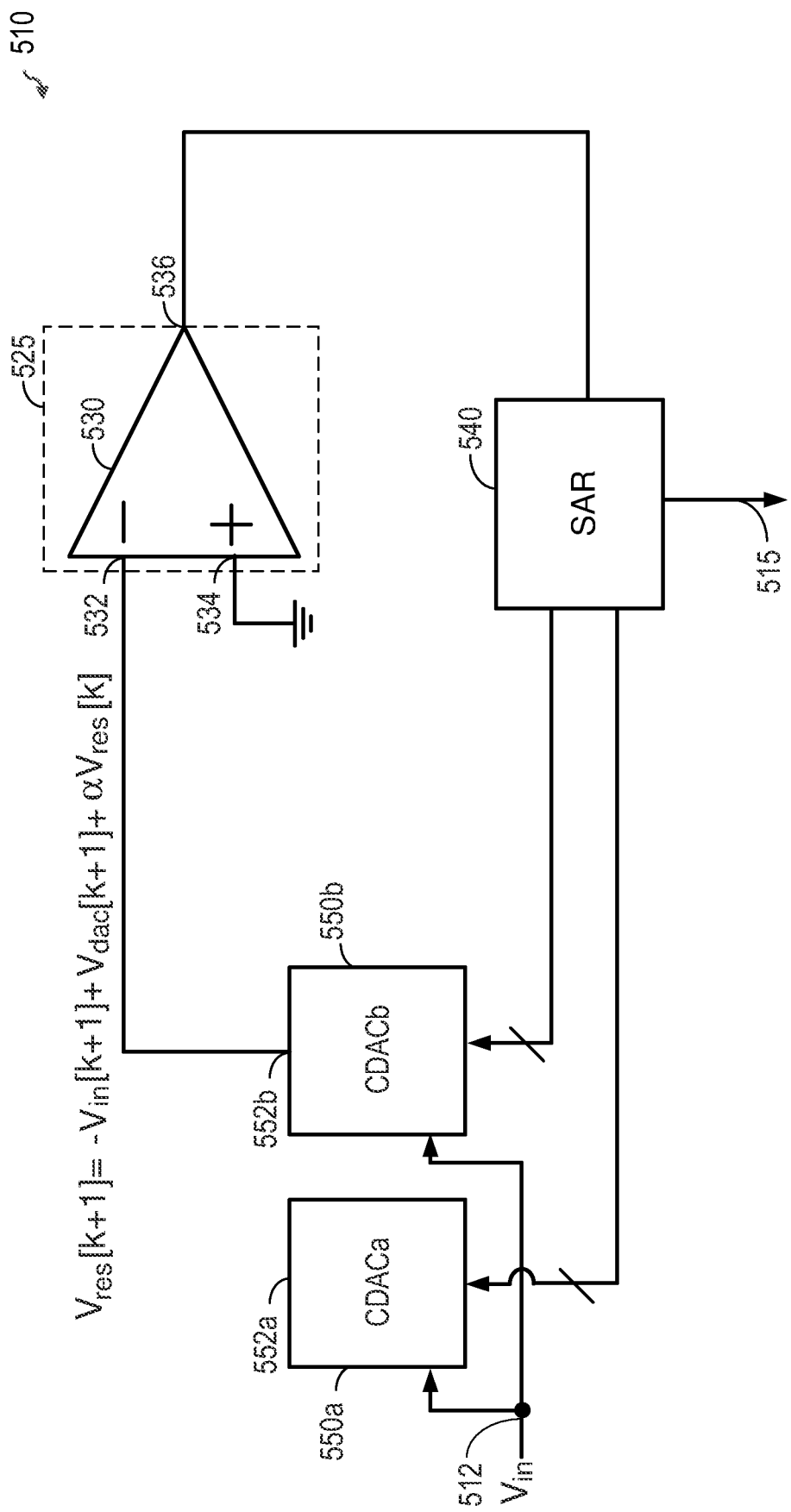
FIG. 6E shows an example of an equivalent circuit of the SAR ADC during a conversion phase of the $(k+1)^{th}$ conversion cycle according to certain aspects of the present disclosure.

After the input analog voltages $V_{in}$ has been sampled, the SAR ADC 510 enters the conversion phase of the $(k+1)^{th}$ conversion cycle. FIG. 6E shows an example of an equivalent circuit of the SAR ADC 510 during the conversion phase of the $(k+1)^{th}$ conversion cycle. At the start of the conversion phase, the switch controller 565 opens the first switch 538 (shown in FIG. 5) and closes the second switch 548 to operate the comparator 525 in the compare mode. The switch circuit 520 (shown in FIG. 5) leaves the output 552b of the second capacitive DAC 550b coupled to the first input 532 of the comparator 525.

During the conversion phase for the $(k+1)^{th}$ conversion cycle, the SAR 540 converts the sampled input analog voltages $V_{in}$ into a second digital value using the second capacitive DAC 550b. To do this, the SAR 540 may output a second digital signal to the second capacitive DAC 550b, and sequentially resolve the N bits $b_1$ to $b_N$ of the second digital signal based on the output of the comparator 525. For example, the SAR 540 may resolve the N bits $b_1$ to $b_N$ using the exemplary binary search discussed above with reference to FIG. 4. After all N bits $b_1$ to $b_N$ of the second digital signal have been resolved, the SAR 540 may output the resolved bits $b_1$ to $b_N$ as the second digital value at the digital output 515 of the SAR ADC 510.

At the end of the conversion phase for the $(k+1)^{th}$ conversion cycle, the residue voltage $V_{res}[k+1]$ for the $(k+1)^{th}$ conversion cycle includes the residue voltage $V_{res}[k]$ from the $k^{th}$ conversion cycle, which is the previous conversion cycle with respect to the $(k+1)^{th}$ conversion cycle. This is because the residue voltage $V_{res}[k]$ from the $k^{th}$ conversion cycle is transferred to the $(k+1)^{th}$ conversion cycle during the sampling phase of the $(k+1)^{th}$ conversion cycle, as discussed above with reference to FIG. 6D.

The SAR ADC 510 may repeat the above exemplary operations illustrated in FIGS. 6A to 6E for subsequent conversion cycles, in which the SAR ADC 510 alternates between using the first capacitive DAC 550a and the second capacitive DAC 550b to convert the input analog voltages $V_{in}$ into a digital value. As discussed above, the SAR ADC 510 implements noise shaping by operating the amplifier 530 of the comparator 525 in the feedback mode during the sampling phase of each conversion cycle to transfer the residue voltage from the previous conversion cycle to the current conversion cycle.

In the above discussion, the $k^{th}$ conversion cycle may also be referred to as a first conversion cycle, and the $(k+1)^{th}$ conversion cycle may also be referred to as a second conversion cycle to distinguish between the $k^{th}$ conversion cycle and the $(k+1)^{th}$ conversion cycle. In the above example, the $k^{th}$ conversion cycle is a previous conversion cycle with respect to the $(k+1)^{th}$ conversion cycle.

The SAR ADC 510 overcomes one or more drawbacks of prior noise-shaping approaches. As discussed above, in some approaches, large capacitors are used to transfer residue charge between conversions cycles, in which the large capacitors may be much larger (e.g., ten times larger) than a capacitive DAC. The large capacitors may significantly increase the size of the SAR ADC. The SAR ADC 510 does not require the use of capacitors that are much larger than a capacitive DAC to transfer residue charge. This is because the SAR ADC 510 reuses the amplifier 530 of the comparator 525 to transfer the residue voltage by operating the amplifier 530 in the feedback mode. The SAR ADC 510 includes an additional capacitive DAC for noise shaping. However, the additional capacitive DAC may result in a substantially smaller increase in the size of the SAR ADC 510 compared with approaches that use capacitors much larger than a capacitive DAC to transfer residue charge.

The SAR ADC 510 also does not require the use of complex filtering and additional high-performance amplifiers, which are becoming increasingly difficult to implement in modern processes and may significantly increase complexity and power consumption. Thus, the SAR ADC 510 may be easier to implement and consume less power than approaches using complex filtering and additional high-performance amplifiers.

Although the second input 534 of the comparator 525 is coupled to ground in the compare mode in the example shown in FIG. 5, it is to be appreciated that the present disclosure is not limited to this example. In general, the second input 534 of the comparator 525 is coupled to a compare voltage, and the comparator 525 compares the compare voltage with the output voltage of the first capacitive DAC 550a or the second capacitive DAC 550b to generate a compare value at the output 536 of the comparator 525. In general, the second switch 548 is coupled between the second input 534 of the comparator 525 and the compare voltage, and the switch controller 565 closes the second switch 548 in the compare mode to couple the second input 534 to the compare voltage in the compare mode. FIG. 5 shows an example in which the compare voltage is ground.

As discussed above, each of the first capacitive DAC 550a and the second capacitive DAC 550b may be implemented with the capacitive DAC 450 shown in FIG. 4. In this regard, FIG. 7 shows an example in which each of the first capacitive DAC 550a and the second capacitive DAC 550b is implemented with the capacitive DAC 450 shown in FIG. 4.

In this example, the first capacitive DAC 550a includes a first capacitor array 455a and a first switch network 470a. The first capacitor array 455a includes a first set of capacitors 460a-1 to 460a-N, in which each of the capacitors 460a-1 to 460a-N corresponds to a respective one of the N bits $b_1$ to $b_N$ of a digital signal input to the first switch network 470a from the SAR 540. The capacitors 460a-1 to 460a-N may have binary-weighted capacitances with capacitor 460a-1 corresponding to the MSB $b_1$ having the largest capacitance and the capacitor 460a-N corresponding to the LSB $b_N$ having the smallest capacitance. In this example, the first set of capacitors 460a-1 to 460a-N is a first set of binary-weighted capacitors. The first terminals 464a-1 to 464a-N of the capacitors 460a-1 to 460a-N are coupled to the output 552a of the first capacitive DAC 550a, and the second terminals 466a-1 to 466a-N of the capacitors 460a-1 to 460a-N are coupled to the first switch network 470a. In this example, the first switch network 470a is configured to couple the second terminals 466a-1 to 466a-N of the capacitors 460a-1 to 460a-N to the analog input 512 to sample the input analog signal $V_{in}$ during a sampling phase. When a bit is set to one, the first switch network 470a may be configured to couple the second terminal of the respective one of the capacitors 460a-1 to 460a-N to the reference voltage $V_{ref}$, and, when the bit is set to zero, the first switch network 470a may be configured to couple the second terminal of the respective one of the capacitors 460a-1 to 460b-N to ground. However, the present disclosure is not limited to this example. In another example, when a bit is set to one, the first switch network 470a may be configured to couple the second terminal of the respective one of the capacitors 460a-1 to 460a-N to a first reference voltage, and, when the bit is set to zero, the first switch network 470a may be configured to couple the second terminal of the respective one of the capacitors 460a-1 to 460a-N to a second reference voltage, in which the first reference voltage is greater than the second reference voltage.

Figure 7:
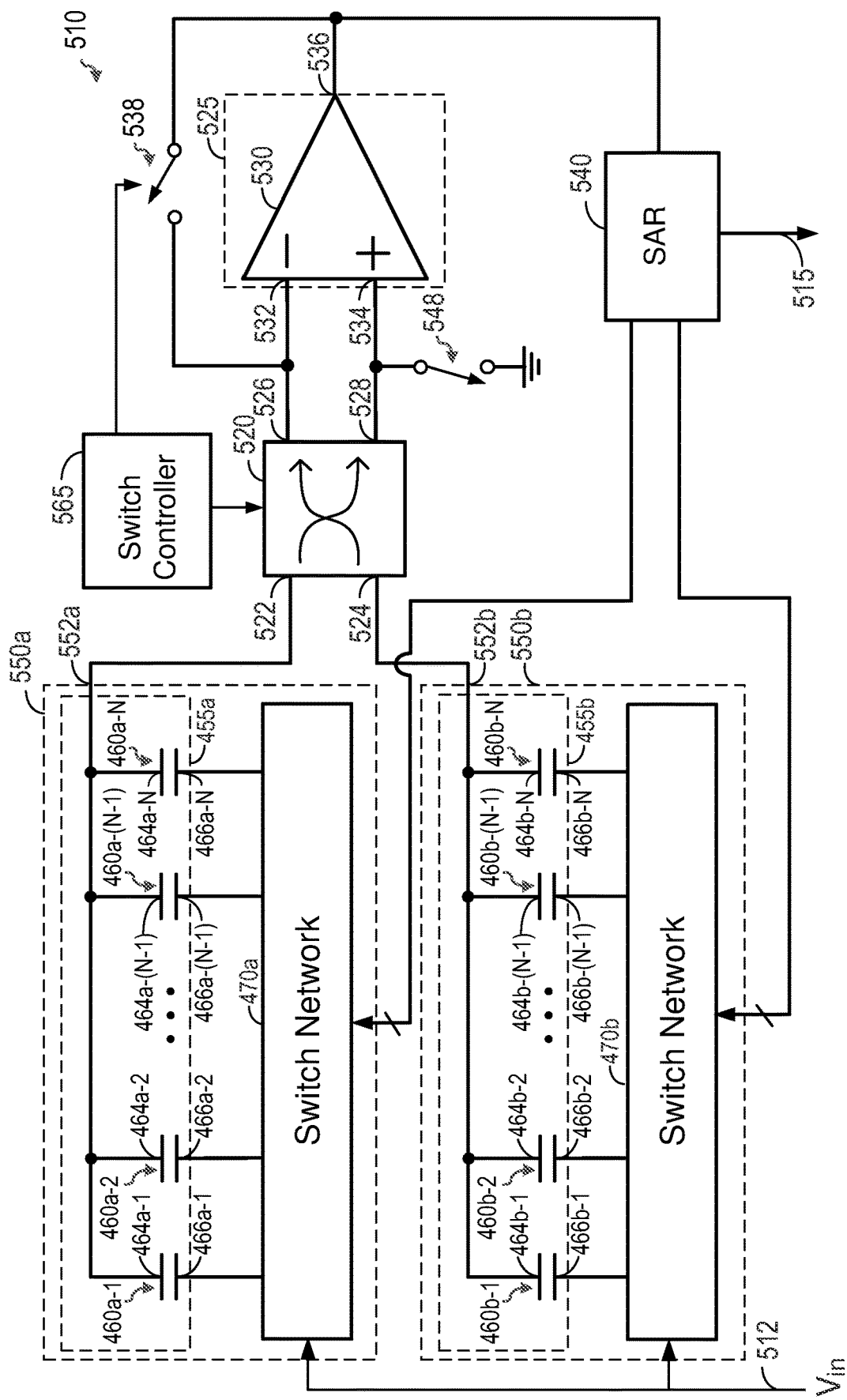
FIG. 7 shows an exemplary implementation of a first capacitive DAC and a second capacitive DAC according to certain aspects of the present disclosure.

In the example in FIG. 7, the second capacitive DAC 550b includes a second capacitor array 455b and a second switch network 470b. The second capacitor array 455b includes a second set of capacitors 460b-1 to 460b-N, in which each of the capacitors 460b-1 to 460b-N corresponds to a respective one of the N bits $b_1$ to $b_N$ of a digital signal input to the second switch network 470b from the SAR 540. The capacitors 460b-1 to 460b-N may have binary-weighted capacitances with capacitor 460b-1 corresponding to the MSB $b_1$ having the largest capacitance and the capacitor 460b-N corresponding to the LSB $b_N$ having the smallest capacitance. In this example, the second set of capacitors 460a-1 to 460a-N is a second set of binary-weighted capacitors. The first terminals 464b-1 to 464b-N of the capacitors 460b-1 to 460b-N are coupled to the output 552b of the second capacitive DAC 550b, and the second terminals 466b-1 to 466b-N of the capacitors 460b-1 to 460b-N are coupled to the second switch network 470b. In this example, the second switch network 470b is configured to couple the second terminals 466b-1 to 466b-N of the capacitors 460b-1 to 460b-N to the analog input 512 to sample the input analog signal $V_{in}$ during a sampling phase. When a bit is set to one, the second switch network 470b may be configured to couple the second terminal of the respective one of the capacitors 460b-1 to 460b-N to the reference voltage $V_{ref}$, and, when the bit is set to zero, the second switch network 470b may be configured to couple the second terminal of the respective one of the capacitors 460b-1 to 460b-N to ground. However, the present disclosure is not limited to this example. In another example, when a bit is set to one, the second switch network 470b may be configured to couple the second terminal of the respective one of the capacitors 460b-1 to 460b-N to a first reference voltage, and, when the bit is set to zero, the second switch network 470b may be configured to couple the second terminal of the respective one of the capacitors 460b-1 to 460b-N to a second reference voltage, in which the first reference voltage is greater than the second reference voltage.

Although FIG. 4 shows an example in which the switch control logic 475 is implemented in the capacitive DAC 450, it is to be appreciated that the present disclosure is not limited to this example. In some implementations, the switch control logic 475 may be incorporated into the SAR 440. In these implementations, the digital signal output by the SAR 440 to the capacitive DAC 450 may include switch control signals, in which each switch control signal corresponds to a respective one of the bits $b_1$ to $b_N$ and controls the respective one of the switches 472-1 to 472-N based on the bit value of the respective bit. Thus, in this example, each one of the bits $b_1$ to $b_N$ of the digital signal is represented by the respective switch control signal, which controls the respective one of the switches 472-1 to 472-N according to the bit value of the respective bit. The digital signal output by the SAR 540 in FIG. 5 to the first capacitive DAC 550a or the second capacitive DAC 550b is intended to cover both the case where switch control logic is implemented in the first capacitive DAC 550a and the second capacitive DAC 550b and the case where switch control logic is implemented in the SAR 540.

The SAR ADC 510 may be used in various systems to convert an analog signal into a digital signal. For example, the SAR ADC 510 may be used in the system 110 shown in FIG. 1 to implement the ADC 140, in which the analog input 512 of the SAR ADC 510 is coupled to the output of the receiver 130, and the digital output 515 of the SAR ADC 510 is coupled to the processor 150. In this example, the SAR ADC 510 converts an analog signal from the receiver 130 into a digital signal, and outputs the digital signal to the processor 150. The SAR ADC 510 may also be used in the system 210 shown in FIG. 2 to implement the ADC 240, in which the analog input 512 of the SAR ADC 510 is coupled to the output of the receiver 230, and the digital output 515 of the SAR ADC 510 is coupled to the processor 250. In this example, the SAR ADC 510 converts an analog signal from the receiver 230 into a digital signal, and outputs the digital signal to the processor 250.

Figure 8:
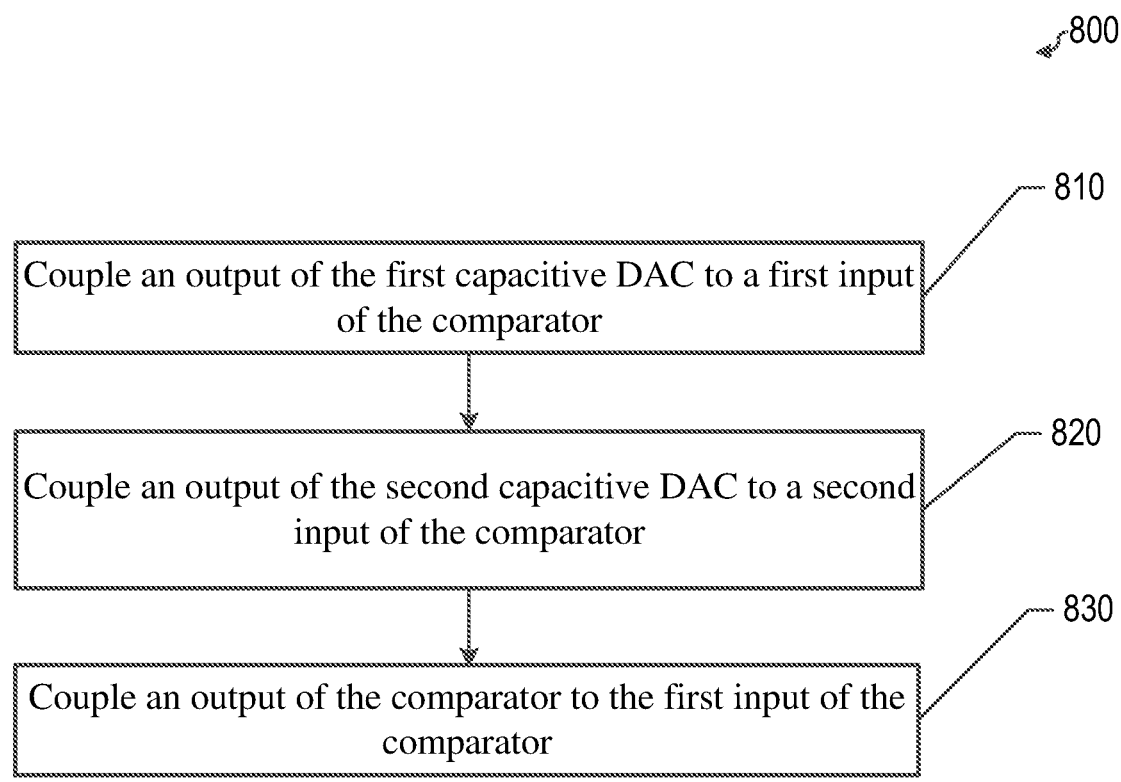
FIG. 8 is a flowchart illustrating a method for noise shaping according to certain aspects of the present disclosure.

FIG. 8 illustrates a method 800 for noise shaping in an analog-to-digital converter according to certain aspects of the present disclosure. The analog-to-digital converter (e.g., SAR ADC 510) includes a first capacitive DAC (e.g., first capacitive DAC 550a), a second DAC (e.g., second capacitive DAC 550b), and a comparator (e.g., comparator 525).

At block 810, an output of the first capacitive DAC is coupled to a first input of the comparator. For example, the output (e.g., output 552a) of the first capacitive DAC (e.g., first capacitive DAC 550a) may be coupled to the first input (e.g., first input 532) of the comparator (e.g., comparator 525) by a switch circuit (e.g., switch circuit 520).

At block 820, an output of the second capacitive DAC is coupled to a second input of the comparator. For example, the output (e.g., output 552b) of the second capacitive DAC (e.g., second capacitive DAC 550b) may be coupled to the second input (e.g., second input 534) of the comparator (e.g., comparator 525) by the switch circuit (e.g., switch circuit 520).

At block 830, an output of the comparator is coupled to the first input of the comparator. For example, the output (e.g., output 536) of the comparator (e.g., comparator 525) may be coupled to the first input (e.g., first input 532) of the comparator by closing a first switch (e.g., first switch 538) between the output of the comparator and the first input of the comparator. The output of the comparator may be coupled to the first input of the comparator to operate the comparator in a feedback mode to transfer a residue voltage from the second capacitive DAC to the first capacitive DAC for noise shaping.

The method 800 may also include sampling an analog input voltage (e.g., analog input voltage $V_{in}$) using the first capacitive DAC.

The method 800 may also include, after the output of the comparator is coupled to the first input of the comparator, decoupling the output of the comparator from the first input of the comparator, and coupling the second input of the comparator to a compare voltage. This may be done to operate the comparator in a compare mode after the transfer of the residue voltage to the first capacitive DAC. The output of the comparator may be decoupled from the first input of the comparator by opening the first switch (e.g., first switch 538) and the second input of the comparator may be coupled to the compare voltage by closing a second switch (e.g., second switch 548). In one example, the compare voltage may be ground.

The method 800 may also include, after the output of the comparator is decoupled from the first input of the comparator, inputting a digital signal to the first capacitive DAC, and resolving N bits of the digital signal based on a compare signal from the output of the comparator. The digital signal may be input to the first capacitive DAC by SAR (e.g., SAR 540), and the N bits of the digital signal may be resolved based on the compare signal by the SAR.

The method 800 may also include, after the N bits of the digital signal are resolved, decoupling the second input of the comparator from the compare voltage, coupling the output of the first capacitive DAC to the second input of the comparator, coupling the output of the second capacitive DAC to the first input of the comparator, and coupling the output of the comparator to the first input of the comparator. The second input of the comparator may be decoupled from the compare voltage by opening the second switch (e.g., second switch 548), and the output of the comparator may be coupled to the first input of the comparator by closing the first switch (e.g., first switch 538).

It is to be appreciated that the present disclosure is not limited to the exemplary terminology used above to describe aspects of the present disclosure. For example, a sampling phase may also be referred to as an acquisition phase or another term. In another example, a digital signal may also be referred to as a digital code or another term. In another example, a SAR may also be referred to as SAR logic, a SAR circuit, or another term. In another example, a capacitor array may also be referred to as a capacitor network, or another term.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An analog-to-digital converter, comprising:
    a first capacitive digital-to-analog converter (DAC);
    a second capacitive DAC;
    a comparator including a first input, a second input, and an output;
    a switch circuit including a first input coupled to the first capacitive DAC, a second input coupled to the second capacitive DAC, a first output coupled to the first input of the comparator, and a second output coupled to the second input of the comparator;
    a first switch coupled between the output of the comparator and the first input of the comparator; and
    a successive approximation register (SAR) coupled to the output of the comparator, the first capacitive DAC, and the second capacitive DAC.

2. The analog-to-digital converter of claim 1, wherein the comparator comprises an amplifier including an inverting input coupled to the first input of the comparator, a non-inverting input coupled to the second input of the comparator, and an output coupled to the output of the comparator.

3. The analog-to-digital converter of claim 1, further comprising a second switch coupled between the second input of the comparator and a compare voltage.

4. The analog-to-digital converter of claim 3, further comprising a switch controller, wherein the switch controller is configured to:
    close the first switch and open the second switch to operate the comparator in a feedback mode; and
    open the first switch and close the second switch to operate the comparator in a compare mode.

5. The analog-to-digital converter of claim 3, wherein the compare voltage comprises a ground.

6. The analog-to-digital converter of claim 1, wherein:
    during a sampling phase of a first conversion cycle, the first capacitive DAC is configured to sample an analog input voltage;
    during a conversion phase of the first conversion cycle, the SAR is configured to:
        output a first digital signal to the first capacitive DAC; and resolve N bits of the first digital signal based on a compare signal from the output of the comparator.

7. The analog-to-digital converter of claim 6, wherein:
during a sampling phase of a second conversion cycle, the second capacitive DAC is configured to sample the analog input voltage;
during a conversion phase of the second conversion cycle, the SAR is configured to:
output a second digital signal to the second capacitive DAC; and
resolve N bits of the second digital signal based on the compare signal from the output of the comparator.

8. The analog-to-digital converter of claim 7, further comprising a switch controller, wherein the switch controller is configured to close the first switch during the sampling phase of the second conversion cycle.

9. The analog-to-digital converter of claim 8, wherein the switch controller is configured to open the first switch during the conversion phase of the second conversion cycle.

10. The analog-to-digital converter of claim 7, wherein:
the switch circuit is configured to:
selectively couple the first capacitive DAC to the first input of the comparator or the second input of the comparator; and
selectively couple the second capacitive DAC to the first input of the comparator or the second input of the comparator; and
the analog-to-digital converter further comprises a switch controller, wherein the switch controller is configured to:
instruct the switch circuit to couple the first capacitive DAC to the second input of the comparator during the sampling phase of the second conversion cycle; and
instruct the switch circuit to couple the second capacitive DAC to the first input of the comparator during the sampling phase of the second conversion cycle.

11. The analog-to-digital converter of claim 10, wherein the switch controller is configured to close the first switch during the sampling phase of the second conversion cycle.

12. The analog-to-digital converter of claim 11, wherein the switch controller is configured to open the first switch during the conversion phase of the second conversion cycle.

13. The analog-to-digital converter of claim 12, further comprising a second switch coupled between the second input of the comparator and a compare voltage, wherein the switch controller is configured to:
open the second switch during the sampling phase of the second conversion cycle; and
close the second switch during the conversion phase of the second conversion cycle.

14. The analog-to-digital converter of claim 1, wherein:
the first capacitive DAC comprises:
a first capacitor array; and
a first switch network coupled to the first capacitor array; and
the second capacitive DAC comprises:
a second capacitor array; and
a second switch network coupled to the second capacitor array.

15. The analog-to-digital converter of claim 14, wherein the first capacitor array comprises a first set of binary-weighted capacitors, and the second capacitor array comprises a second set of binary-weighted capacitors.

16. A method for noise shaping in an analog-to-digital converter,
wherein the analog-to-digital converter includes a first capacitive digital-to-analog converter (DAC), a second DAC, and a comparator, the method comprising:
coupling an output of the first capacitive DAC to a first input of the comparator;
coupling an output of the second capacitive DAC to a second input of the comparator;
coupling an output of the comparator to the first input of the comparator;
after the output of the comparator is coupled to the first input of the comparator, decoupling the output of the comparator from the first input of the comparator; and
coupling the second input of the comparator to a compare voltage.

17. The method of claim 16, further comprising sampling an analog input voltage using the first capacitive DAC.

18. The method of claim 16, wherein the compare voltage comprises a ground.

19. The method of claim 16, wherein, after the output of the comparator is decoupled from the first input of the comparator, the method further comprises:
inputting a digital signal to the first capacitive DAC; and
resolving N bits of the digital signal based on a compare signal from the output of the comparator.

20. The method of claim 19, wherein, after the N bits of the digital signal are resolved, the method further comprises:
decoupling the second input of the comparator from the compare voltage;
coupling the output of the first capacitive DAC to the second input of the comparator;
coupling the output of the second capacitive DAC to the first input of the comparator; and
coupling the output of the comparator to the first input of the comparator.

21. The method of claim 16, wherein the comparator comprises an amplifier including an inverting input coupled to the first input of the comparator, a non-inverting input coupled to the second input of the comparator, and an output coupled to the output of the comparator.

22. An apparatus for noise shaping in an analog-to-digital converter, wherein the analog-to-digital converter includes a first capacitive digital-to-analog converter (DAC), a second DAC, and a comparator, the apparatus comprising:
means for coupling an output of the first capacitive DAC to a first input of the comparator;
means for coupling an output of the second capacitive DAC to a second input of the comparator;
means for coupling an output of the comparator to the first input of the comparator;
means for decoupling the output of the comparator from the first input of the comparator after the output of the comparator is coupled to the first input of the comparator; and
means for coupling the second input of the comparator to a compare voltage.

23. The apparatus of claim 22, wherein the compare voltage comprises a ground.

24. The apparatus of claim 22, wherein the apparatus further comprises:
means for inputting a digital signal to the first capacitive DAC after the output of the comparator is decoupled from the first input of the comparator; and
means for resolving N bits of the digital signal based on a compare signal from the output of the comparator.

* * * * *